(12) United States Patent
Brunschwiler et al.

(10) Patent No.: US 9,054,074 B2
(45) Date of Patent: Jun. 9, 2015

(54) ONE-DIMENSIONAL HIERARCHICAL NESTED CHANNEL DESIGN FOR CONTINUOUS FEED MANUFACTURING PROCESSES

(75) Inventors: Thomas J. Brunschwiler, Ihalwil (CH); Ryan J. Linderman, Zurich (CH); Erich M. Ruetsche, Pfaeffikon (CH)

(73) Assignee: International Business Machines Corporation, Armonk, NY (US)

( * ) Notice: Subject to any disclaimer, the term of this patent is extended or adjusted under 35 U.S.C. 154(b) by 1844 days.

(21) Appl. No.: 11/957,576

(22) Filed: Dec. 17, 2007

(65) Prior Publication Data

US 2009/0154107 A1    Jun. 18, 2009

(51) Int. Cl.
  *H05K 7/20*    (2006.01)
  *H01L 23/42*   (2006.01)
(52) U.S. Cl.
  CPC ............ *H01L 23/42* (2013.01); *Y10T 29/4935* (2013.01); *H01L 2924/0002* (2013.01)
(58) Field of Classification Search
  USPC .................................................. 257/706–719
  See application file for complete search history.

(56) References Cited

U.S. PATENT DOCUMENTS

| 5,345,107 | A  | * | 9/1994  | Daikoku et al. ............... 257/717 |
| 5,817,242 | A  | * | 10/1998 | Biebuyck et al. ............... 216/41  |
| 5,825,087 | A  | * | 10/1998 | Iruvanti et al. ................ 257/707 |
| 6,774,482 | B2 | * | 8/2004  | Colgan et al. ................. 257/712 |
| 7,282,799 | B2 |   | 10/2007 | Brunschwiler et al. |
| 2005/0077618 | A1 | * | 4/2005 | McCutcheon et al. ........ 257/712 |
| 2005/0263879 | A1 | * | 12/2005 | Michel et al. ................ 257/706 |

OTHER PUBLICATIONS

Linderman, R. et al "Hierarchical Nested Surface Channels for Reduced Particle Stacking and Low-Resistance Thermal Interfaces" Semiconductor Thermal Measurement and Management Symposium, 2007.

\* cited by examiner

*Primary Examiner* — David Vu
*Assistant Examiner* — Jonathan Han
(74) *Attorney, Agent, or Firm* — Ryan, Mason & Lewis, LLP

(57) ABSTRACT

A series of hierarchical channels are formed in a first member surface of a first member using a continuous-feed manufacturing process. The channels are configured to control particle stacking. The first member is pressed to a second member with a layer of particle-filled viscous material between the first member surface and a second member surface of the second member. An inventive assembly includes mating surfaces with at least one surface formed with a series of parallel hierarchical channels configured to control stacking of the particles during pressing together of the surfaces. The surface is substantially free of any other hierarchical channels formed thereon.

25 Claims, 5 Drawing Sheets

ONE-DIMENSIONAL HIERARCHICAL NESTED CHANNEL DESIGN FOR CONTINUOUS FEED MANUFACTURING PROCESSES

FIELD OF THE INVENTION

The present invention generally relates to the electrical and electronic arts and, more particularly, to formation of thermal (and other) interfaces for packaging of electronic circuits and/or components, and the like.

BACKGROUND OF THE INVENTION

Modern electronic circuits and components may have quite high power densities. The interface between an electronic circuit or component, and a heat sink, should exhibit low thermal resistance so that heat can be conducted away from the circuit or component. One technique for achieving such low thermal resistance interfaces is the use of particle-filled adhesives or greases. Such adhesives and greases are also employed in other applications, for example, as electrical interfaces when the particles are electrically conductive or as mechanical bonds that may be enhanced by particles or fibers added to an adhesive matrix.

Co-assigned US Patent Publication 2005-0263879 of Michel et al., (now U.S. Pat. No. 7,748,440), discloses a patterned structure for a thermal interface. The Michel et al. invention provides a thermal interface with a first and a second face that are in contact to each other by a thermal conducting material. A first face includes grooves that are at least partly filled with the thermal conducting material, wherein at least two types of grooves are arranged, namely first grooves having a larger width than second grooves. The first face comprises an array with protrusions that are confined by the second grooves, the array being divided by the first grooves into sub-arrays.

SUMMARY OF THE INVENTION

Principles of the present invention provide techniques for one-dimensional hierarchical nested channel designs for continuous feed manufacturing processes. An exemplary embodiment of a method for forming an interface, according to one aspect of the present invention, includes the steps of forming a series of hierarchical channels in a first member surface of a first member using a continuous-feed manufacturing process, the channels being configured to control particle stacking; and pressing the first member to a second member with a layer of particle-filled viscous material between the first member surface and a second member surface of the second member.

In another aspect, an inventive assembly includes a first member having a first member surface; a second member having a second member surface; and a layer of particle-filled viscous material pressed between the first member surface and the second member surface. At least one of the surfaces is formed with a series of hierarchical channels configured to control stacking of the particles during pressing together of the surfaces, and the hierarchical channels are substantially parallel. The at least one of the surfaces is substantially free of any other hierarchical channels formed thereon.

One or more embodiments of the invention advantageously provide a one-dimensional channel nesting configuration that accommodates localized high heat flux or hot-spot zones and can be manufactured using extrusion, rolling or other continuous feed systems.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

One or more embodiments of the invention provide a design methodology for hierarchical nested channels, which is compatible with continuous feed manufacturing systems, while still producing a significant benefit in terms of controlled particle stacking and assembly pressure. The improvement of thermal interfaces is one of the simplest and lowest cost ways to extend the limits of current thermal management solutions and to improve the performance of electrical interfaces made from particle filled materials. In one or more embodiments of the invention, the interface of the cooling device, chip or substrate is patterned with an inventive layout.

Alternatively, the 1-D hierarchy channel pattern can also be built into the surface of a roller used for roll-to-roll high volume manufacturing. When the channels are integrated onto the surface of the roller, they allow the deposition of high particle concentration lines on the target surface, for applications such as electrical current collection on flexible solar panels manufactured on thin polymer layers. This will be discussed further below with regard to FIG. 8.

Inventive techniques can be employed, for example, in conjunction with particle filled thermal and electrical pastes and adhesives. Further, one or more embodiments of the invention substantially reduce or eliminate the problem of interface aging, as long-term voiding is substantially reduced or eliminated, by reducing the pressure drop of the interface material during thermal cycling of the interface system.

Continuous feed manufacturing systems, such as extrusion and rolling, typically result in the lowest cost parts due to the high rate of production and reduced need for secondary manufacturing steps. Such manufacturing systems only allow one to define a cross-section profile without three-dimensional features. One or more hierarchical channel designs, in accordance with the invention, are compatible with the reduced geometrical complexity of continuous-feed systems, while still providing a benefit in terms of particle stacking control and reduced assembly pressure. The particle stacking pattern resulting from an interface with a length many times longer than its width is also simplified, as compared to more "square-like" interfaces, leaving a particle stack equally spaced between the neighboring channels or interface edges.

Figure 1:
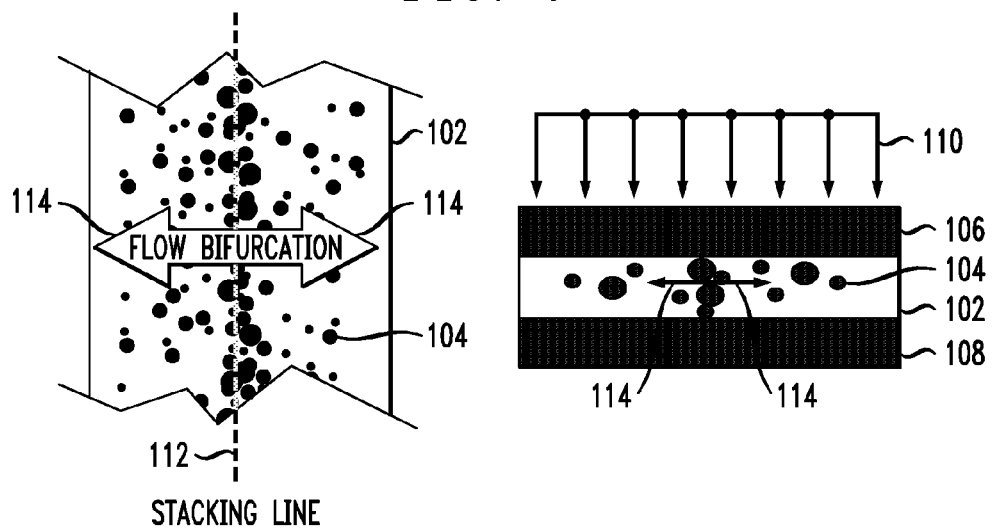
FIG. 1 shows a simplified stacking pattern for an infinite aspect ratio interface (length>>width)

FIG. 1 shows a simplified stacking pattern for an infinite aspect ratio interface (length>>width). A material 102, such as adhesive or grease, includes particles 104 (which may be, for example, thermally and/or electrically conductive). The material 102 is "squeezed" as first and second plates 106, 108 are forced together (as symbolized by arrows 110). The plates mentioned herein can, in general, be any types of structures or components; by way of example and not limitation, cold plates, heat pipe evaporators, or other heat sinks; electronic circuits or components or packages for such components or circuits, or the surface of a roller (for example, interfacing with a workpiece) and so on. While the terminology "plate(s)" is employed for the examples in the specification, in general, techniques can be applied to first and second members having surfaces; the members can be, for example, any of the aforementioned structures or components. The material 102 is substantially incompressible, and accordingly "spreads out" as plates 106, 108 are forced together; by symmetry, the flow will bifurcate at the stacking line 112 (as best seen in the detail at the left of FIG. 1). The flow bifurcation is symbolized by arrows 114. Due to the bifurcation of flow to the parallel edges, in contrast to the "X" pattern associated with square or near 1:1 aspect ratio interfaces, the aforementioned simplified particle stacking pattern is obtained.

Figure 2:
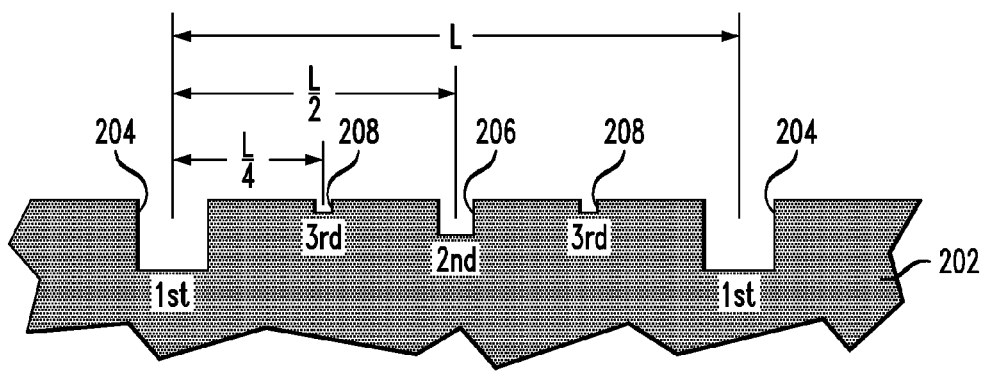
FIG. 2 shows an exemplary one-dimensional hierarchical channel design, according to an aspect of the invention.

In order to provide a channel design that is compatible with an extrusion profile or master roller, and which provides good control of particle stacking and pressure reduction, while maintaining a high solid fill factor, an inventive channel pattern rule is defined based on the limited geometry of the system. One exemplary approach, depicted in FIG. 2, begins by subdividing the interface 202 into a number of equal lengths, L, with the first level of hierarchy or largest channels 204, then dividing these regions in half with a smaller second level hierarchy (channel 206), and in half again with a third level channel 208 with the smallest dimensions. This subdivision of additional hierarchies can continue depending on the need for reduced assembly pressure and particle stacking. Thus, it will be appreciated that in general terms, more or fewer subdivisions can be employed, and further, that FIG. 2 depicts only one repeating portion of what is typically a large array of channels. Further, note that in one or more embodiments, the hierarchical channels are substantially parallel and there are no other hierarchical channels formed in the surface with the hierarchical channels, that is, two-dimensional hierarchical patterns are not employed, such that hierarchical channels are advantageously formed with the aforementioned continuous-feed manufacturing process.

The (local or global) pitch, L, of first level channels 204 can, in some instances, be chosen so as not to block regions of higher heat or electrical current flux near concentrated sources. That is, near such sources, channels would not be located, such that only the relatively thin layer of material 102 would separate the plates 106, 108, thereby resulting in less temperature drop or voltage drop, as compared to the case where heat or current had to flow around the channel to reach the surface or through a greater thickness of material due to the presence of the channel. Note that the bondline thickness 102 should not be confused with the thickness of material between the bottom of a channel and the opposing surface (102+channel depth).

For the case of substantially uniformly distributed thermal and/or electrical sources, the first level channels 204 can be chosen so as to maintain reservoirs of interface material at key locations that are preferential for reliability or mechanical reasons, such as the center of the total interface or along regions of higher mechanical stress.

Figure 3:
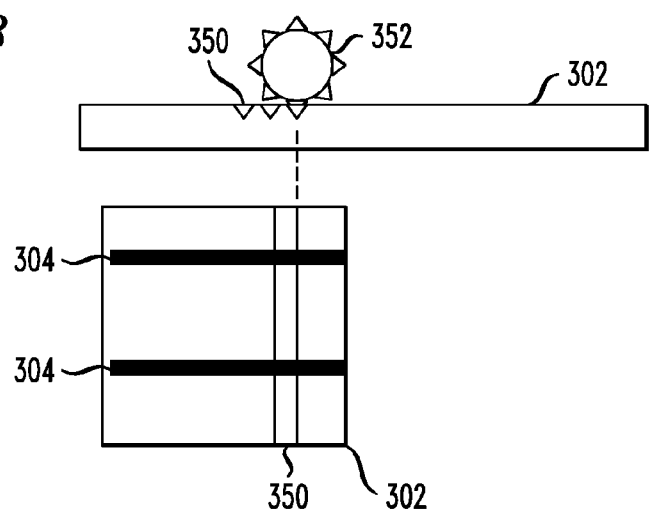
FIG. 3 shows an exemplary optional secondary finishing technique, according to another aspect of the invention.

Attention should now be given to FIG. 3. In order to increase the performance of the channeled interface, additional finishing steps can optionally be performed, such as orthogonal channel crosscutting with an array of saw blades, stamping, rolling, and so on, after the pieces have been extruded. The orthogonal channels need not be hierarchical. These finishing steps allow the particle filled interface material to flow between the extruded or rolled channel hierarchies via a network of intersecting channels added through the finishing steps. In FIG. 3, the lower left-hand corner presents a top plan view of a plate 302 having a plurality of first level channels 304, similar to channels 204 of FIG. 2, which may be formed by a continuous feed process, such as extruding or rolling. At the top of the figure, a side elevation view of plate 302 is presented. As shown, a plurality of orthogonal channels 350 may be formed, for example, by "imprinting" with a roller wheel 352 (as noted just above, other techniques, such as gang-sawing, stamping, and so on, could also be employed). In another approach, channels can be formed on both surfaces (e.g., plates 106, 108), using extrusion, rolling, or other techniques, and can be oriented orthogonal to each other upon assembly (see discussion of FIG. 7 below). In some instances, one surface could have hierarchical channel sizes as described herein, while the other might have uniform channel sizes.

Design of the one-dimensional hierarchy channel width and depth is preferably based on the requirements of the continuous feed parameters, such as draft angles and maximum aspect ratio for extrusion reliability. Channels should be given as high of an aspect ratio (that is, the depth below the surface divided by the width) as possible, so as to have a beneficial impact on the flow of material 102, without constricting heat flow through the solid surface 202. As is the case with two-dimensional hierarchical nested channel arrays, the minimum channel depth is preferably determined by the maximum particle size of the particles 104 in the interface material 102 (typically, the minimum channel depth is approximately 2-3 times the maximum particle size). Minimum channel depth applies to channels in the smallest level of hierarchy 208.

Figure 4:
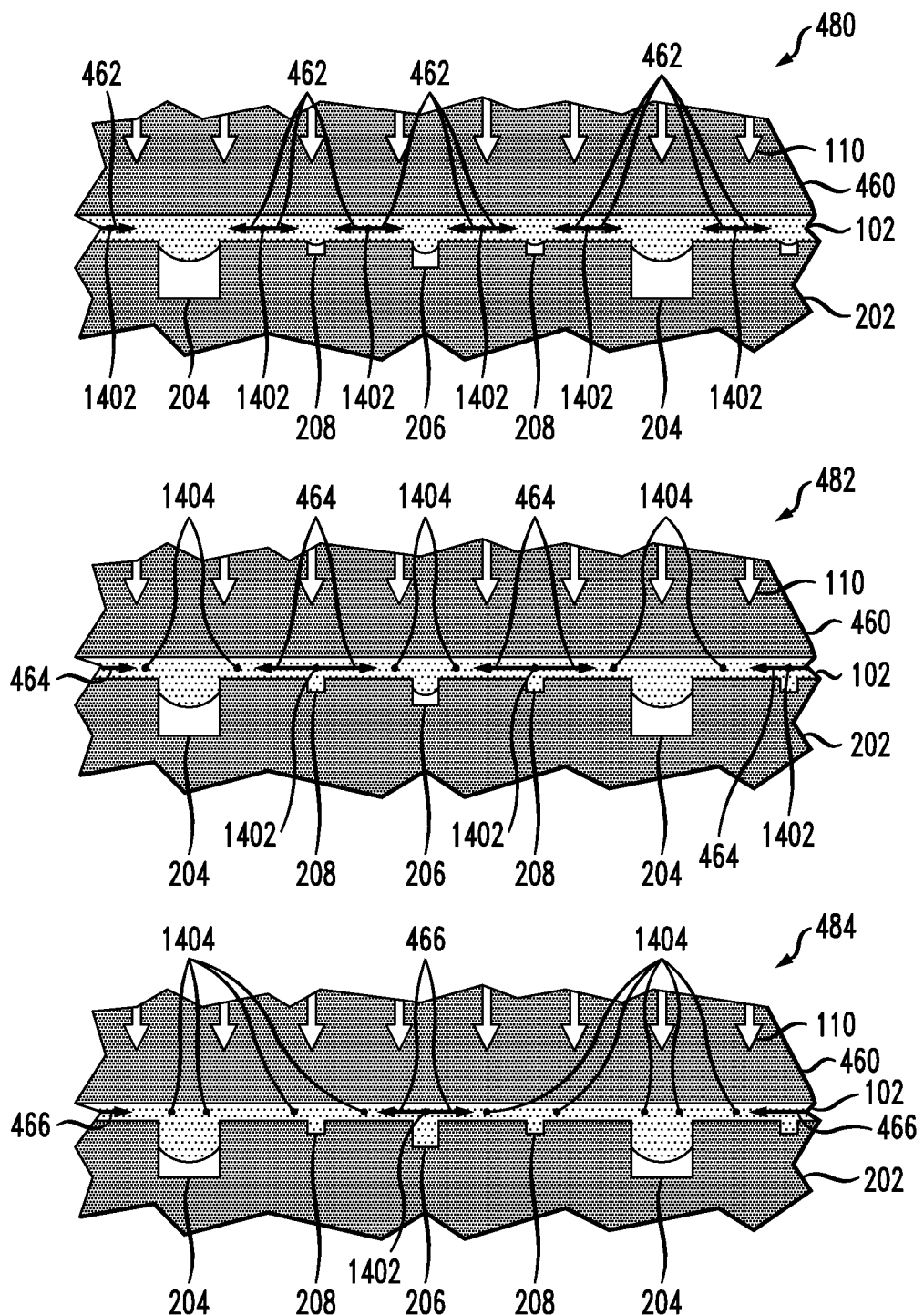
FIG. 4 presents an exemplary series of views illustrating transition of bifurcation zones through sequential filling of each channel hierarchy, according to yet another aspect of the invention.

Attention should now be given to FIG. 4. Due to the placement of the channel hierarchies, the flow bifurcation zones are continuously shifting throughout the assembly of the interface, as smaller channels become filled with interface material. FIG. 4 shows three successive views, 480, 482, and 484, as assembly proceeds. Elements 102, 110, 202, 204, 206, and 208 are as described above. Material 102 is squeezed between plates 460 and 202. In view 480, assembly has just started, and flow bifurcates substantially midway between the channels 204, 206, 208, as shown by arrows 462. Once the smallest channels 208 have filled, as shown in view 482, flow now bifurcates over channels 208 as these are approximately halfway between channels 204 and 206, as shown by arrows 464. The second level channels 206 serve as a final collection zone for large particles caught in the final bifurcation system. Higher particle concentrations or stacking lines from earlier phases of the assembly are also pushed to the $1^{st}$ level channels 204 at the end of the assembly process, as shown in view 484, where flow bifurcates over channels 206, as shown by arrows 466.

By way of summary and conclusion, FIG. 4 shows transition of bifurcation zones (horizontal arrows 462, 464, 466) through sequential filling of each channel hierarchy. Spots 1402 between arrows 462, 464, 466 indicate potential stacking regions, with spots 1404 in views 482, 484 indicating a stacking region that has been pushed to a new location or diffused as the assembly progress and flow directions change.

In order to control the transitions between bifurcation zones, one or more embodiments scale the channel depth and width between the hierarchies—for example, the $2^{nd}$ level channels 206 are about one-half the cross sectional area of the first level channels 204 (the drawings are not necessarily to any scale or proportion). Dimensioning of the channels begins by defining the minimum bondline thickness based on maximum particle size. The channels do not effectively disrupt the flow pattern of the adhesive or grease until the bondline becomes considerably smaller than the channel depth; thus, the smallest channels should not be designed with a depth value smaller than the maximum particle size, unless the channel is intended to absorb the final particle stack at the end of the assembly process. Hierarchy levels with larger channels can then be scaled up from the minimum channel dimension. Channel dimensions can also be chosen such that the channel becomes filled with material at a given bondline thickness by calculating the displaced volume of grease or adhesive from an initial thickness and defining channels with a similar volume.

Figure 5:
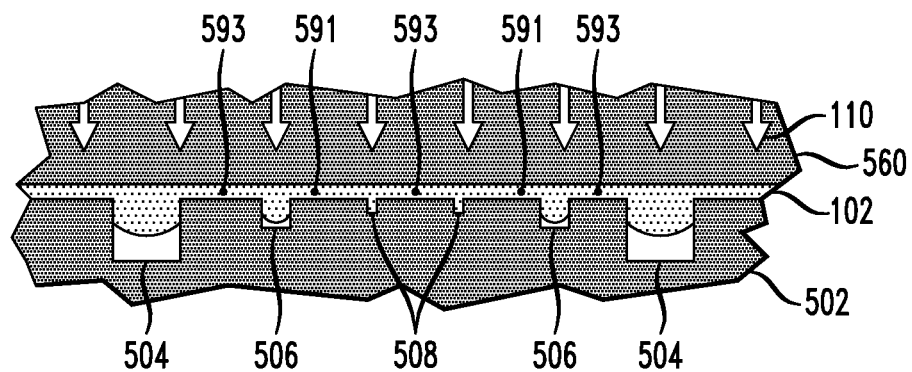
FIG. 5 shows final stack positions for a channel design intended to produce higher concentrations of particles in specific locations, according to still another aspect of the invention.

In some instances of the invention, the channel design can also be modified (enhanced or optimized) so as to intentionally create regions of higher particle concentration or stacking at specific locations, instead of seeking to avoid such regions. FIG. 5 depicts final stack positions for a channel design intended to produce higher concentrations of particles in specific locations. As the bifurcation is controlled by the channel dimensions and initial material thickness, a stacking line can be deposited in specific locations if desired. The higher concentrations in FIG. 5 are in the middle between the two smallest channels 508, since this is a flow bifurcation point at all stages of assembly. The spots 593 are the final particle stack locations, while spots 591 are intermediate bifurcation points. The channels in plate 502 are designated 504, 506, 508, from largest to smallest, while the upper plate is designated as 560. Material 102 and arrows 110 are as described before.

Typically, high volume manufacturing processes allow geometrical optimization in a two-dimensional plane. This plane could, for example, be the cap-to-cold plate interface (etching, coining, rolling, and the like) or a cross-section of the part orthogonal to the interface (extrusion). Optimized paste evacuation geometries with minimal heat flux constriction include semi-buried channels, as opposed to channels with a large surface opening and narrowing cross section. Attention should now be given to FIG. 6. Due to the low thermal conductivity of the grease or adhesive material 102, as compared to the material of the adjacent plate, heat flux peaks in the adhesive or grease layers should preferably be reduce or minimized. Heat flux mal-distribution in the cap (referred to generically elsewhere herein as a plate) is not as great a concern, since its thermal conductivity is significantly greater, for example, up to 100 times larger, than that of the interface material 102.

Figure 6:
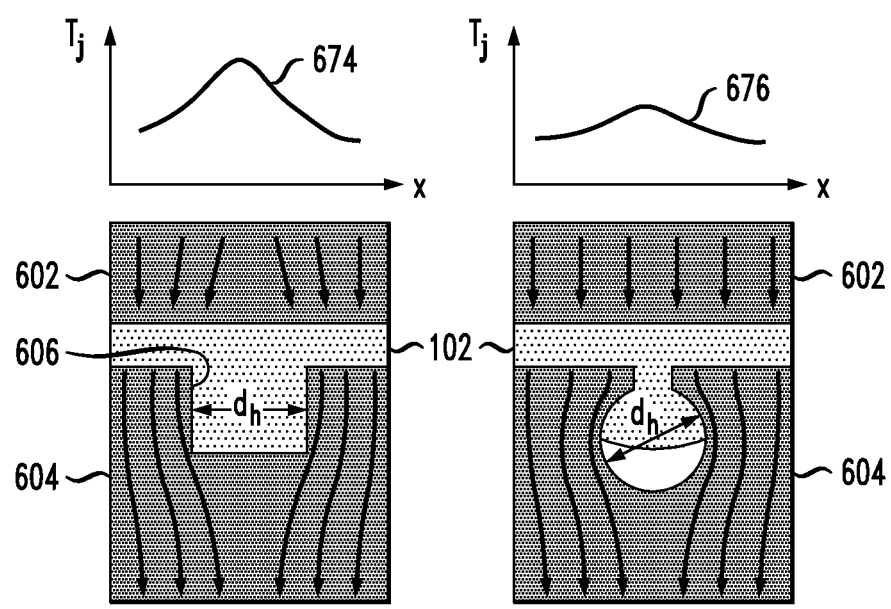
FIG. 6 presents non-limiting examples of different types of channels that may be employed in one or more inventive embodiments.

FIG. 6 shows two cases of upper and lower plates 602, 604. In the left-hand case, the channel 606 is of substantially uniform width $d_h$ over its entire depth. The right-hand case shows a channel with a narrow opening and a substantially circular cross-section with diameter $d_h$ recessed below the surface of plate 604. It will be appreciated, based on the discussion in the previous paragraph, that the nominal width of the channels should be preferably offset below the surface of the cap or heat sink respectively (represented by generic plate 604 in the figure), so as to preserve heat transfer area at the interface surface. Ideally, the minimum channel openings would be equal to the size of the largest expected particle 104 in the interface material 102. This technique permits the contact surface fill-factor to be increased for a given channel hydraulic diameter $d_h$, and the temperature profile is flattened (compare profile 674 to profile 676). The profiles 674, 676 show the temperature plotted against transverse position X; the peak of 674 is substantially higher than that of 676 because more interface surface area in the left-hand case is taken up by relatively poorly-conducting material 102.

Surface patterning processes are only able to form open or narrowing channel geometries. However, extrusion processes allow the optimization of channel geometry in the cross-section plane. Semi-buried channels, as shown on the right-hand side of FIG. 6, are able to substantially improve or optimize the system performance, in terms of minimal peak temperature for a given hydraulic diameter of the channels.

Channel cross sections for extrusion profiles can also be enhanced or optimized based on a trade-off between mechanical, thermal, and extrusion process needs, that may result in triangular or diamond shaped profiles being preferred. A one-dimensional hierarchy of channels can also be integrated so as to control bifurcation and particle stacking patterns during assembly of the interface, as discussed above.

As some parts may require channels on several sides of an extruded piece in order to improve a multiplicity of thermal (or other) interfaces, channels can be added as needed to an extrusion profile or roller surfaces. Chip packaging lids often require an optimized thermal interface with the chip on the inside of the package (TIM1) and a second interface (TIM2) between the package and cooler on the outside of the package. For such a component, aspects of the invention can be employed wherein an extrusion cross section is used that has channel features on both top and bottom surfaces.

One or more exemplary embodiments of the invention have been presented herein. For illustrative purposes, applications pertaining to thermal control applications have been discussed. However, aspects of the invention are also valuable for the general case of improved bonding with adhesives, as one or more embodiments allow creation of thinner bondlines for non-thermal as well as thermal applications.

Figure 7:
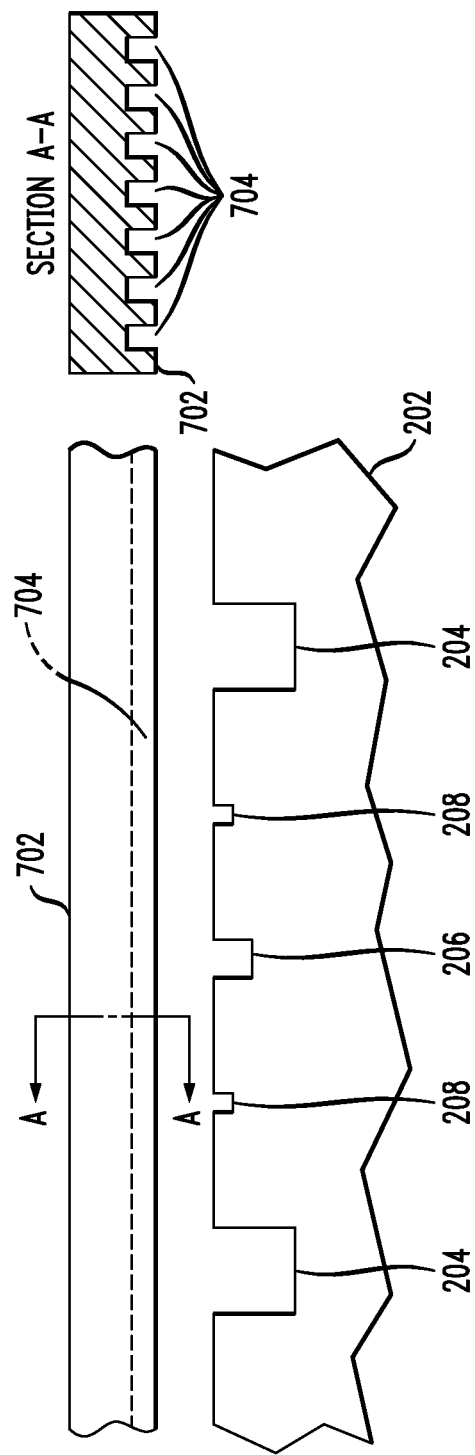
FIG. 7 depicts an embodiment with orthogonal channels on mating surfaces, according to a further aspect of the invention.

Attention should now be given to FIG. 7. A plate 202 as described above can be mated to another plate 702 with a series of channels 704 which need not be hierarchical. Grease or adhesive is omitted from FIG. 7 for clarity. Upon assembly, channels 704 can be oriented substantially orthogonally to hierarchical channels 204, 206, 208. Section A-A is taken along cutting plane line A-A.

Figure 8:
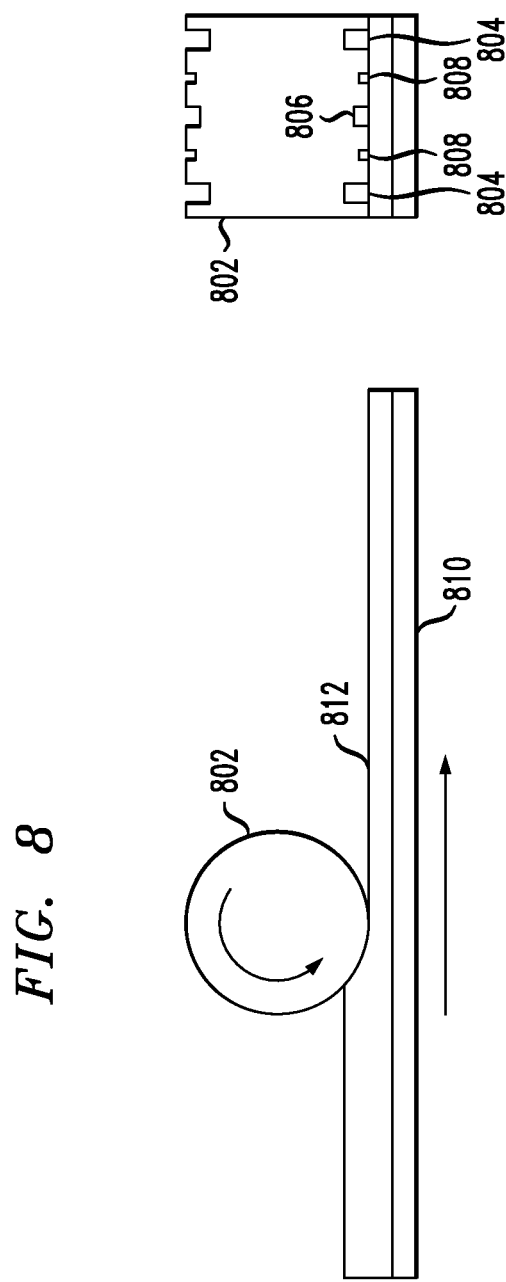
FIG. 8 depicts an embodiment with hierarchical channels on a roller, according to still a further embodiment of the invention.

As noted above, an inventive 1-D hierarchy channel pattern can also be built into the surface of a roller used for roll-to-roll high volume manufacturing. As shown in FIG. 8, channels 804, 806, 808 are integrated onto the surface of the roller 802, and they allow the deposition of high particle concentration lines of material 812 on the target surface of workpiece 810, for applications such as electrical current collection on flexible solar panels manufactured on thin polymer layers. "Parallel" hierarchical channels, in the context of a roller surface, mean that the channel centerlines define substantially parallel planes when viewed end-on as at the right hand side of FIG. 8. The hierarchical channels in a cylindrical roller would not necessarily be formed by a continuous manufacturing or rolling process. Because this is a master part used for extended periods, it could be formed with more expensive or time consuming approaches.

In yet another aspect of the invention, one or more techniques set forth herein can be used to obtain mechanical benefits of controlled particle or "fiber" stacking in adhesive and cured structural materials (i.e., composite glues). This aspect is beneficial, for example, for composite adhesives filled with carbon fibers or carbon nanotubes, as the fibers improve mechanical properties, but too high of a density of fibers results in poor mechanical performance.

The techniques set forth herein can be used, for example, to package and cool circuits realized on an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end or consumer electronic applications to advanced computer products. The techniques set forth herein can be used, by way of example and not limitation, for thermal, mechanical, and/or electrical interfaces for a variety of electronic packages.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An assembly comprising:
   a first member having a first member surface;
   a second member having a second member surface; and
   a layer of particle-filled viscous material pressed between said first member surface and said second member surface;
   wherein at least one of said surfaces is formed with a series of hierarchical channels configured to control stacking of said particles during pressing together of said surfaces, said hierarchical channels being substantially parallel, said at least one of said surfaces being substantially free of any other hierarchical channels formed thereon, and wherein each level of said hierarchy is characterized by a distinct combination of channel width and channel depth.

2. The assembly of claim 1, wherein said hierarchical channels are configured to reduce said stacking of said particles.

3. The assembly of claim 2, wherein said hierarchical channels comprise a first substantially uniformly spaced series of channels and a second series of channels substantially intermediate said first channels, said second series of channels being smaller in cross-section than said first series of channels.

4. The assembly of claim 3, wherein said second series of channels are smaller in cross-section than said first series of channels by a factor of about one-half.

5. The assembly of claim 3, wherein said hierarchical channels further comprise a third series of channels substantially intermediate said first and second channels, said third series of channels being smaller in cross-section than said second series of channels.

6. The assembly of claim 1, wherein said at least one of said surfaces is further formed with a series of non-hierarchical channels substantially orthogonal to said hierarchical channels.

7. The assembly of claim 1, wherein said hierarchical channels are formed in said first member surface and wherein said second member surface is formed with a series of channels positioned substantially orthogonal to said hierarchical channels in said first member surface when said first and second surfaces are assembled.

8. The assembly of claim 1, wherein said hierarchical channels are configured to locally increase said stacking of said particles in predetermined locations.

9. The assembly of claim 1, wherein said hierarchical channels have surface openings and maximum diameters, and wherein said channels are partially buried in said at least one of said surfaces, with said surface openings being smaller than said maximum diameters, whereby heat transfer at said surfaces is substantially preserved.

10. The assembly of claim 1, wherein said material comprises one of an adhesive and a conductive grease.

11. The assembly of claim 1, wherein said particles are conductive.

12. The assembly of claim 1, wherein said first member surface is formed with said series of hierarchical channels, said first member is substantially cylindrical, and said second member comprises a workpiece.

13. A method of forming an interface, said method comprising the steps of:
   forming a series of hierarchical channels in a first member surface of a first member using a continuous-feed manufacturing process, said channels being configured to control particle stacking, and wherein each level of said hierarchy is characterized by a distinct combination of channel width and channel depth; and pressing said first member to a second member with a layer of particle-filled viscous material between said first member surface and a second member surface of said second member.

14. The method of claim 13, wherein said forming comprises at least one of extruding and rolling.

15. The method of claim 13, wherein said hierarchical channels are configured to reduce said stacking of said particles.

16. The method of claim 15, wherein said hierarchical channels comprise a first substantially uniformly spaced series of channels and a second series of channels substantially intermediate said first channels, said second series of channels being smaller in cross-section than said first series of channels by a factor of about one-half.

17. The method of claim 16, wherein said hierarchical channels further comprise a third series of channels substantially intermediate said first and second channels, said third series of channels being smaller in cross-section than said second series of channels.

18. The method of claim 13, further comprising the additional step of forming, in said first member surface, a series of non-hierarchical channels substantially orthogonal to said hierarchical channels.

19. The method of claim 13, further comprising the additional steps of:
forming, in said second member surface, a series of channels; and
positioning said channels in said second member surface so that they are substantially orthogonal to said hierarchical channels in said first member surface during said assembling step.

20. The method of claim 13, wherein said hierarchical channels are configured to locally increase said stacking of said particles in predetermined locations.

21. The method of claim 13, wherein said hierarchical channels have surface openings and maximum diameters, and wherein said channels are partially buried in said first member surface of said first member, with said surface openings being smaller than said maximum diameters, whereby heat transfer at said first member surface is substantially preserved.

22. The method of claim 13, wherein said material comprises one of an adhesive and a conductive grease, and wherein said particles are conductive.

23. The method of claim 13, further comprising the additional step of orienting said members during said pressing step to reduce blocking of high-flux sources.

24. The method of claim 13, further comprising the additional step of orienting said members during said pressing step so as to maintain reservoirs of said viscous material at key locations.

25. A method of forming an interface, said method comprising the steps of:
forming a series of hierarchical channels in a substantially cylindrical first member surface of a substantially cylindrical first member, said channels being configured to control particle stacking, and wherein each level of said hierarchy is characterized by a distinct combination of channel width and channel depth; and
pressing said first member to a workpiece with a layer of particle-filled viscous material between said first member surface and a surface of said second workpiece.

* * * * *